(12) United States Patent
Hua et al.

(10) Patent No.: US 12,185,521 B2
(45) Date of Patent: Dec. 31, 2024

(54) METHOD FOR MANUFACTURING MEMORY DEVICE AND MEMORY

(71) Applicant: ICLEAGUE TECHNOLOGY CO., LTD., Zhejiang (CN)

(72) Inventors: Wenyu Hua, Jiaxing (CN); Fandong Liu, Jiaxing (CN); Xiao Ding, Jiaxing (CN)

(73) Assignee: ICLEAGUE TECHNOLOGY CO., LTD., Zhejiang (CN)

( * ) Notice: Subject to any disclaimer, the term of this patent is extended or adjusted under 35 U.S.C. 154(b) by 0 days.

(21) Appl. No.: 17/782,791

(22) PCT Filed: Aug. 6, 2021

(86) PCT No.: PCT/CN2021/111344
§ 371 (c)(1),
(2) Date: Jun. 6, 2022

(87) PCT Pub. No.: WO2023/272882
PCT Pub. Date: Jan. 5, 2023

(65) Prior Publication Data
US 2024/0188276 A1  Jun. 6, 2024

(30) Foreign Application Priority Data

Jul. 1, 2021 (CN) .......................... 202110742958.8

(51) Int. Cl.
*H10B 12/00* (2023.01)
*G11C 11/4091* (2006.01)

(52) U.S. Cl.
CPC ........... *H10B 12/09* (2023.02); *H10B 12/315* (2023.02); *H10B 12/50* (2023.02); *G11C 11/4091* (2013.01)

(58) Field of Classification Search
CPC ...... H10B 12/09; H10B 12/50; H10B 12/315; G11C 11/4091
(Continued)

(56) References Cited

U.S. PATENT DOCUMENTS 5,416,350 A  5/1995 Watanabe
5,757,710 A  5/1998 Li et al.
(Continued)

FOREIGN PATENT DOCUMENTS

CN  1220464 A  6/1999
CN  1255752 A  6/2000
(Continued)

OTHER PUBLICATIONS

International Search Report mailed on Mar. 30, 2022, by the Chinese Patent Office as the International Searching Authority for International Application No. PCT/CN2021/111344.
(Continued)

*Primary Examiner* — Tu-Tu V Ho
(74) *Attorney, Agent, or Firm* — Buchanan Ingersoll & Rooney PC

(57) ABSTRACT

Embodiments of the disclosure provide a method for manufacturing a memory device, the method includes operations. At least one cell block is formed on a wafer, each of the at least one cell block includes multiple memory cells distributed in an array, each of the multiple memory cells includes a transistor and a storage capacitor connected to a source of the transistor. Bit lines are formed on the wafer, and each of the bit lines is connected to a drain of the transistor, here each of the bit lines and the storage capacitor are located on opposite surfaces of the wafer in a thickness direction respectively. A peripheral circuit is formed above the bit lines on the wafer along a perpendicular of the wafer, here the peripheral circuit includes at least a Sensing Amplifier (Continued)

(SA). An electrical connection is formed between the bit line and the SA.

10 Claims, 14 Drawing Sheets

(58) Field of Classification Search
USPC .......................................................... 257/296
See application file for complete search history.

(56) References Cited

U.S. PATENT DOCUMENTS

| | | | |
|---|---|---|---|
| 5,917,744 | A | 6/1999 | Kirihata et al. |
| 6,011,737 | A | 1/2000 | Li et al. |
| 6,784,474 | B2 | 8/2004 | Ogawa et al. |
| 7,875,529 | B2 * | 1/2011 | Forbes ................ H01L 25/0657 |
| | | | 438/455 |
| 9,431,068 | B2 | 8/2016 | Clark et al. |
| 2001/0030884 | A1 | 10/2001 | Frey |
| 2003/0012117 | A1 | 1/2003 | Ogawa et al. |
| 2004/0174735 | A1 | 9/2004 | Agata |
| 2004/0262656 | A1 | 12/2004 | Uemura |
| 2006/0054950 | A1 | 3/2006 | Baek |
| 2012/0018801 | A1 | 1/2012 | Kobayashi |
| 2014/0119099 | A1 | 5/2014 | Clark et al. |
| 2016/0336056 | A1 | 11/2016 | Clark et al. |

FOREIGN PATENT DOCUMENTS

| | | |
|---|---|---|
| CN | 1484860 A | 3/2004 |
| CN | 1586007 A | 2/2005 |
| CN | 102768857 A | 11/2012 |
| CN | 104854698 A | 8/2015 |
| CN | 112071345 A | 12/2020 |
| EP | 1003219 A2 | 5/2000 |
| EP | 1003219 A3 | 6/2001 |
| EP | 1003219 B1 | 12/2011 |
| JP | H0817938 A | 1/1996 |
| JP | 2000082291 A | 3/2000 |

OTHER PUBLICATIONS

English translation of the Written Opinion of the International Search Authority in the International Application No. PCT/CN2021/111344, mailed on Mar. 30, 2022. 3 pages.

* cited by examiner

METHOD FOR MANUFACTURING MEMORY DEVICE AND MEMORY

CROSS-REFERENCE TO RELATED APPLICATIONS

The application is filed based on and claims priority to Chinese Patent Application No. 202110742958.8 filed on Jul. 1, 2021, the entire contents of which are incorporated herein by reference in in its entirety.

TECHNICAL FIELD

The disclosure relates to the technical field of semiconductor, and in particular to a method for manufacturing a memory device and a memory.

BACKGROUND

In the related art, in a storage architecture of Dynamic Random Access Memory (DRAM), a cell block and a Sensing Amplifier (SA) are located in the same plane. As shown in FIG. 1, an SA is usually located between two cell blocks, and two ends of the SA are connected to endpoints of two bit lines of two adjacent cell blocks respectively. Densely arranged storage capacitors are provided above the bit lines. When a position where an SA and a bit line are connected is located at a non-endpoint position on the bit line, a connecting wire needs to be led above the bit line. However, the densely arranged storage capacitors above the bit line leave no space for a lead wire. Therefore, an existing DRAM storage architecture determines that a position where an SA and a bit line are connected may be located only at an endpoint of the bit line.

SUMMARY

Embodiments of the disclosure disclose a method for manufacturing a memory device and a memory.

According to a first aspect of the embodiments of the disclosure, there is provided a method for manufacturing a memory device, the method may include the following operations.

At least one cell block is formed on a wafer, each of the at least one cell block includes multiple memory cells distributed in an array, each of the multiple memory cells includes a transistor and a storage capacitor connected to a source of the transistor.

Bit lines are formed on the wafer, and each of the bit lines is connected to a drain of the transistor, here each of the bit lines and the storage capacitor are located on opposite surfaces of the wafer in a thickness direction respectively.

A peripheral circuit is formed above the bit lines on the wafer along a perpendicular of the wafer, here the peripheral circuit includes at least an SA.

An electrical connection is formed between the bit line and the SA.

Here a distance between a midpoint of each of the bit lines and a position where each of the bit lines and the SA are connected is smaller than a distance between the midpoint of each of the bit lines and any endpoint of each of the bit lines.

Based on the foregoing solution, the wafer may have a first surface and a second surface located on the opposite surfaces of the wafer in the thickness direction respectively.

The operation of forming at least one cell block on the wafer may include the following operations.

Active areas are manufactured on the wafer.

A gate of the transistor is formed in one of the active areas on a first surface of the wafer.

The source of the transistor is formed in the one active area on the first surface of the wafer.

Storage capacitors are formed on the first surface of the wafer, and each of the storage capacitor is connected to the source of the transistor in one of the multiple memory cells to which the storage capacitor belongs.

The drain of the transistor is formed in one of the active areas on a second surface of the wafer.

Based on the foregoing solution, the operation of forming the bit lines on the wafer and connecting each of the bit lines to the drain of the transistor may include the following operations.

Bit lines are formed on the second surface of the wafer, and each of the bit lines is electrically connected to the drain of the transistor.

Based on the foregoing solution, the method may further include the following operations.

Word lines are formed on the first surface of the wafer after the at least one cell block and the bit lines are sequentially formed on the wafer, here each of the word lines is connected to the gate of the transistor.

A protective layer is formed on the first surface of the wafer.

Based on the foregoing solution, the operation of forming the peripheral circuit above the bit lines on the wafer may include at least the following operations.

An insulating layer covering the bit lines is formed above the bit lines on the wafer.

The SA is formed in the insulating layer.

Based on the foregoing solution, the operation of forming the electrical connection between each of the bit line and the SA may include the following operations.

A first connection terminal of each of the bit lines is aligned with a second connection terminal of the SA, and the aligned first connection terminal and second connection terminal are bonded.

Here a position where the first connection terminal and the second connection terminal are bonded is located in a midpoint area of each of the bit lines, and the midpoint area includes a midpoint of each of the bit lines, and a distance between a boundary of the midpoint area and the midpoint is smaller than a distance between the boundary and any endpoint of each of the bit lines.

According to a second aspect of the embodiments of the disclosure, there is provided a memory, the memory may include at least a wafer, at least one cell block and bit lines, and a peripheral circuit.

At least one cell block and bit lines are located on the wafer, each of the at least one cell block includes multiple memory cells distributed in an array, each of the multiple memory cells includes a transistor including a source, a gate and a drain and a storage capacitor connected to the source of the transistor, each of the bit lines is connected to the drain of the transistor in each of the multiple memory cells in the same column of each of the at least one cell block, and each of the bit lines and the storage capacitor are located on opposite surfaces of the wafer in a thickness direction respectively.

The peripheral circuit is located above the bit lines on the wafer along a perpendicular of the wafer, here the peripheral circuit includes at least an SA.

Here a distance between a midpoint of each of the bit lines and a position where each of the bit lines and the SA are connected is smaller than a distance between the midpoint of each of the bit lines and any endpoint of each of the bit lines.

Based on the foregoing solution, the connection position may be located at the midpoint of each of the bit lines.

Based on the foregoing solution, the memory may further include word lines located on the wafer, here each of the word lines is connected to the gate of the transistor in each of the multiple memory cells in the same row of each of the at least one cell block.

Based on the foregoing solution, the transistor may further include a channel region formed in the thickness direction of the wafer.

The source is located at a first end of the channel region.

The drain is located at a second end of the channel region, here the first end and the second end are opposite ends of the channel region in the thickness direction of the wafer respectively.

The gate is located on a side of the channel region and has a direction consistent with that of the channel region.

The method for manufacturing a memory device provided in the embodiments of the disclosure includes the following operations. At least one cell block is formed on a wafer, each of the at least one cell block includes multiple memory cells distributed in an array, each of the multiple memory cells includes a transistor and a storage capacitor connected to a source of the transistor. Bit lines are formed on the wafer, and each of the bit lines is connected to a drain of the transistor, here each of the bit lines and the storage capacitor are located on opposite surfaces of the wafer in a thickness direction respectively. A peripheral circuit is formed above the bit line on the wafer along a perpendicular of the wafer, here the peripheral circuit includes at least an SA. An electrical connection is formed between the bit line and the SA. Here a distance between a midpoint of each of the bit lines and a position where each of the bit lines and the SA are connected is smaller than a distance between the midpoint of each of the bit lines and any endpoint of each of the bit lines. In this way, the cell block and the SA are formed in different planes, an area occupied by the SA in a plane where the cell block is located may be reduced, and a number of memory cells that may be arranged in the cell block may be increased, thereby improving the level of integration of memory cells. In addition, because the bit line and the storage capacitor are not located on the same side of the wafer anymore, a space above the bit line is not blocked anymore. The position where the SA and the bit line are connected may be located at another position on the bit line, and a wire may be led above the bit line to be connected to the SA, but the connection is not limited to an endpoint of the bit line anymore, so that the flexibility of connection is improved, and the connection may be flexibly adjusted according to an actual situation.

EXPLANATION OF REFERENCE NUMERALS

1: wafer; 10: cell block; 11: bit line; 12: peripheral circuit; 100: memory cell; 120: SA;
1000: transistor; and 1001: storage capacitor.

DETAILED DESCRIPTION

In order to make the objectives, technical solutions and advantages of the disclosure clearer, the disclosure is further described in detail below with reference to the drawings. The described embodiments should not be construed as a limitation to the disclosure. All other embodiments obtained by those of ordinary skill in the art without paying any creative work fall within the protection scope of the disclosure.

In the following descriptions, reference is made to "some embodiments", which describes a subset of all possible embodiments, but it may be understood that "some embodiments" may be the same subset or a different subset of all possible embodiments, and may be combined with each other without conflict.

In the following descriptions, reference is made to terms "first", "second" and "third", which are only used to distinguish similar objects and do not denote a specific order of objects, but it may be understood that the terms "first", "second" and "third" are used to interchange specific orders or sequences where appropriate, to enable embodiments of the disclosure described herein to be practiced in an order other than the order shown or described herein.

Unless otherwise defined, all the technical terms and scientific terms used herein have the same meanings as how they are generally understood by those skilled in the art to which the disclosure belongs. The terms used herein are only used to describe objectives of the embodiments of the disclosure, but are not intended to limit the disclosure.

Figure 1:
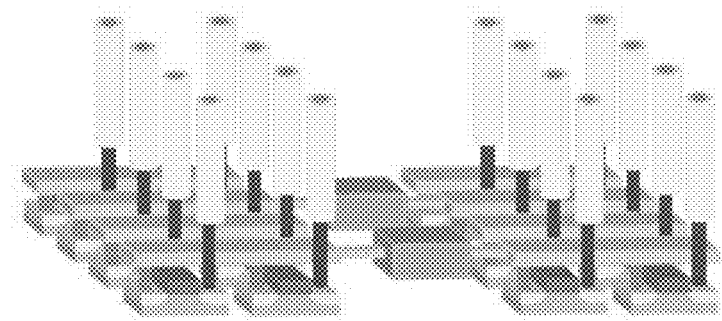
FIG. 1 illustrates a schematic structural diagram of a connection between an SA and a cell block in the related art.
Figure 2:
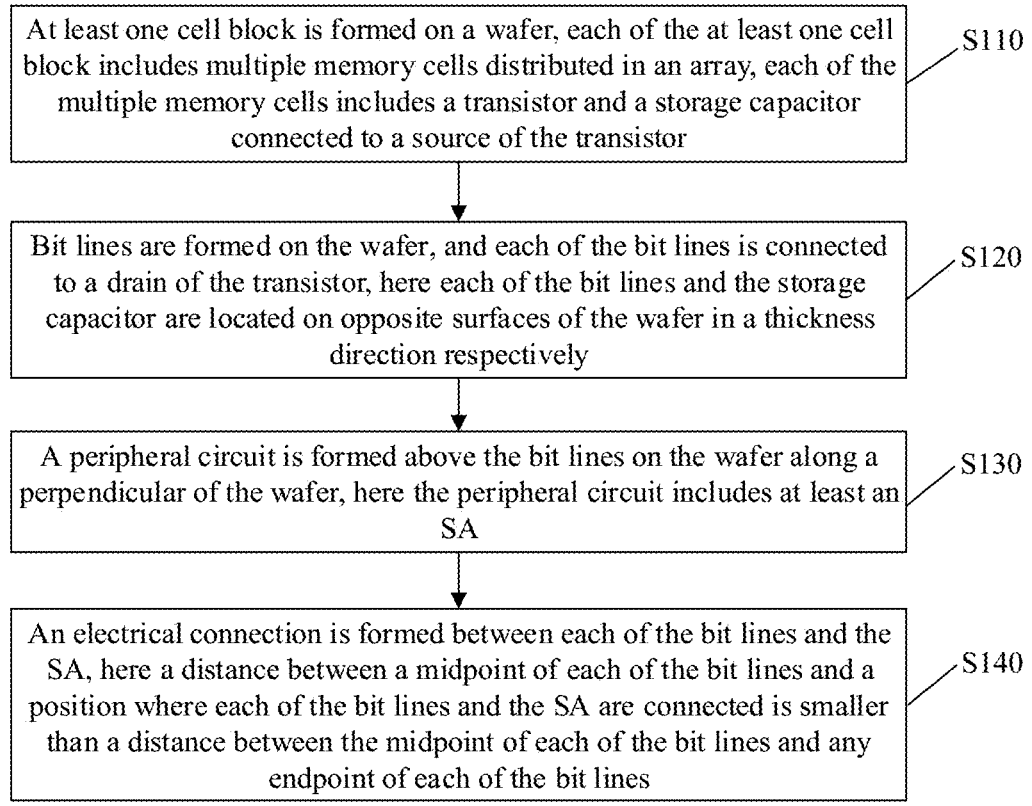
FIG. 2 illustrates a schematic flowchart of a method for manufacturing a memory device according to an exemplary embodiment.

As shown in FIG. 2, the embodiment provides a method for manufacturing a memory device, the method may include the following operations.

In operation S110, at least one cell block is formed on a wafer, each of the at least one cell block includes multiple memory cells distributed in an array, each of the multiple memory cells includes a transistor and a storage capacitor connected to a source of the transistor.

In operation S120, bit lines are formed on the wafer, and each of the bit lines is connected to a drain of the transistor, here each of the bit lines and the storage capacitor are located on opposite surfaces of the wafer in a thickness direction respectively.

In operation S130, a peripheral circuit is formed above the bit lines on the wafer along a perpendicular of the wafer, here the peripheral circuit includes at least an SA.

In operation S140, an electrical connection is formed between the bit line and the SA, here a distance between a midpoint of each of the bit lines and a position where each of the bit lines and the SA are connected is smaller than a distance between the midpoint of each of the bit lines and any endpoint of each of the bit lines.

The method for manufacturing a memory device according to the embodiment is applicable to various memory devices such as DRAM, Ferroelectric Random Access Memory (FRAM), Magneto-resistive Random Access Memory (MRAM), Phase Change Random Access Memory (PCRAM), etc.

The wafer is a silicon wafer used to manufacture a silicon semiconductor circuit. The cell block is used to perform a storage function of data, and includes multiple memory cells. Each memory cell includes a transistor. The transistor may be a planar transistor, a BCAT or the like. Preferably, the transistor is a Vertical Channel Array Transistor (VCAT). The transistor includes a gate G, a source S and a drain D.

The peripheral circuit is a circuit used to implement functions such as signal amplification, address selection, data transfer and the like for a cell block, and includes at least an SA, or may further include a column address controller, a row position controller, a control circuit, an input/output buffer and the like.

In the embodiment, the bit line is manufactured on the wafer. Each cell block includes at least one bit line. The bit line is connected to the drain D of the transistor in the memory cell, and is used to perform a read or write operation on the memory cell to which the transistor belongs, when the transistor is turned on. For example, a bit line may be connected to the drain D of the transistor of each memory cell in the same column of each cell block.

In an embodiment, when the electrical connection is formed between the bit line and the SA, the connection may be implemented in a bonding manner, or the connection may be implemented in another manner such as by manufacturing a metal through hole and a conductive plunger, etc. Because the SA and the cell block are located in different planes and there is no hindrance by the storage capacitor above the bit line anymore, the connection between the SA and the bit line may be led out above the bit line. The position where the SA and the bit line in the cell block are connected is not limited to an endpoint position of the bit line.

Figure 3:
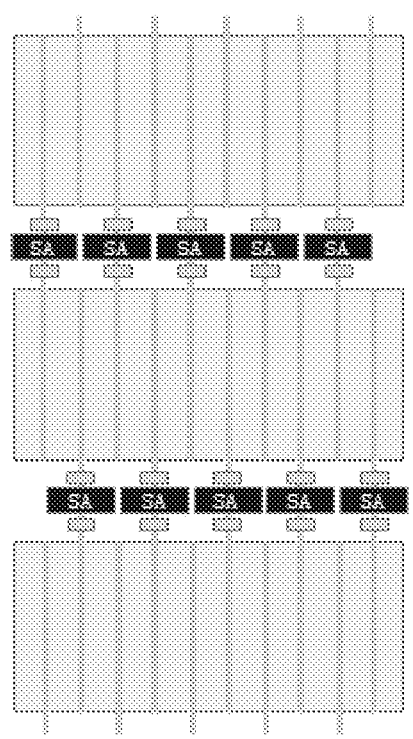
FIG. 3 illustrates a schematic structural diagram of a connection between an SA and a cell block in the related art.

FIG. 3 shows a memory device in which an SA and a cell block are located in the same plane. Two ends of the SA are connected to endpoints of two bit lines respectively.

Figure 4:
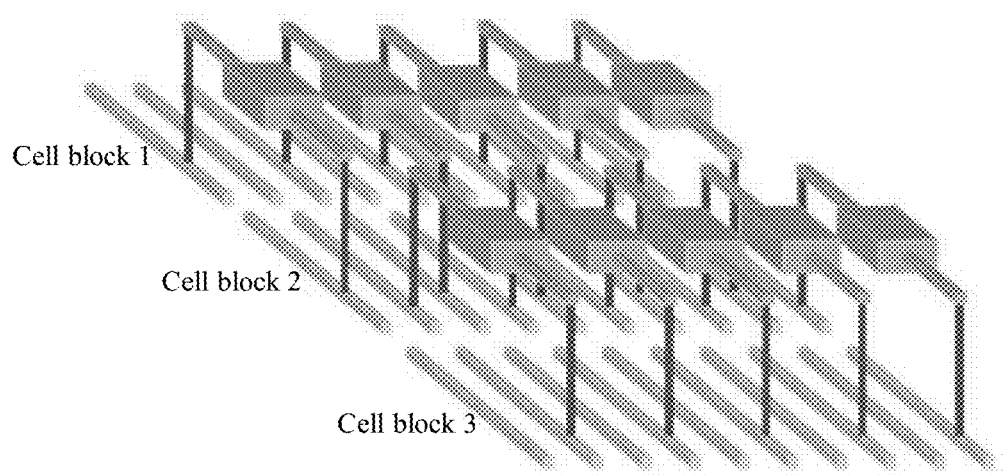
FIG. 4 illustrates a schematic structural diagram of connections between an SA and multiple cell blocks according to an exemplary embodiment.

In an embodiment, two ends of an SA are connected to bit lines in different cell blocks respectively. A bit line of each cell block on the wafer is connected to bit lines of two adjacent cell blocks in a staggered manner. For example, as shown in FIG. 4, a first bit line of a cell block 2 and a first bit line of a cell block 1 are connected by a first SA, a second bit line of the cell block 2 and a second bit line of a cell block 3 are connected by a second SA, a third bit line of the cell block 2 and a third bit line of the cell block 1 are connected by a third SA, . . . and so on. A position where an SA and a bit line are connected may be located at any other position other than endpoints of the bit line. Both positions where the SA and two bit lines are connected should have equal distances to the SA, thereby ensuring amplification effect of the SA, for example, both positions are midpoint positions. In this way, the flexibility of connection positions may be further improved, and it is easy to flexibly select connection positions on the bit line for connection according to different process requirements in actual applications.

In an embodiment, by consideration of difficulty of manufacturing process, the position where the SA and the bit line are connected may be disposed in a particular area on the bit line near the midpoint of the bit line. For example, the distance between the connection position and the midpoint of the bit line is smaller than the distance between the connection position and any endpoint of the bit line. In this way, the position where the bit line and the SA are connected is kept near the midpoint of the bit line, so that the flexibility of connection positions is ensured, and symmetry of a three-dimensional (3D) structure formed by the SA and the cell block is considered, thereby reducing the difficulty of manufacturing process during connection.

Figure 5:
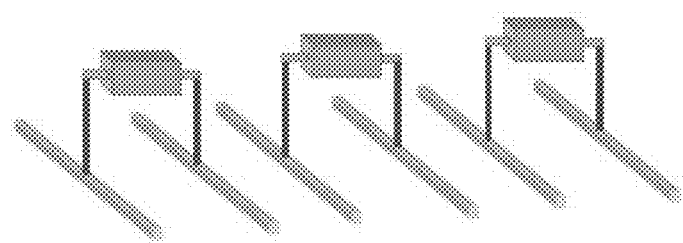
FIG. 5 illustrates a schematic structural diagram of a connection between an SA and the same cell block according to an exemplary embodiment.

In an embodiment, when two ends of an SA are connected to two bit lines in the same cell block respectively, every two adjacent bit lines are connected by an SA. For example, as shown in FIG. 5, a first bit line and a second bit line in the same cell block are connected by an SA, a third bit line and a fourth bit line are connected by an SA, . . . , and so on. In this case, both positions where each SA and two corresponding bit lines are connected are located at the same position near midpoints of the two bit lines respectively, so that more uniform positions where multiple SAs and corresponding bit lines are connected may be obtained, to facilitate quick manufacturing process.

In another embodiment, when an SA is connected to bit lines in different cell blocks respectively, the distance between the connection position and the midpoint of the bit line is smaller than the distance between the connection position and any endpoint of the bit line, and it may usually be satisfied that a distance between both positions where the SA and two bit lines are connected is greater than a size of the SA itself. In this way, a process may be further simplified, and no connections are required right below the SA, thereby improving efficiency of manufacturing process. In addition, because of the size of the SA itself and the dense arrangement of cell blocks on the wafer, when the connection position is located near the midpoint of the bit line, it is more applicable to a 3D structure formed by the SA and the cell block on the wafer, thereby reducing process difficulty during manufacturing.

In this way, a peripheral circuit such as an SA and a cell block are formed in different planes respectively, an area occupied by the SA in a wafer where the cell block is located may be reduced, and arrangement density of cell blocks in a plane where the cell block is located may be increased effectively, thereby improving the level of integration of memory cells. Therefore, compared with the related art, when the wafer has a fixed area, more memory cells may be manufactured on the wafer. In addition, because the SA and the cell block are not located in the same plane anymore, instead they form a 3D structure, an area occupied by the SA in the plane where the cell block is located is avoided, so that an area that needs to be occupied in the plane may be greatly reduced during manufacturing the same number of memory cells.

In another embodiment, an SA and a cell block may be formed on different wafers respectively. For example, a cell block and a bit line are formed on a first wafer, a peripheral circuit is formed on a second wafer. The peripheral circuit includes at least an SA, and the first wafer and the second wafer are further electrically connected, to implement the electrical connection between the SA and the bit line. The first wafer and the second wafer may be connected in a bonding manner. Because the cell block and the SA are located in the same wafer in the related art. Under the influence of mutual constraint of their manufacturing processes, only tungsten may be used for the material of the bit line. When the SA and the cell block are manufactured on different wafers respectively, the mutual influence of manufacturing processes is reduced. Anther metal material, for example, metal such as copper and cobalt, etc. may be used for the bit line, thereby reducing resistivity of the bit line and reducing resistance in the bit line.

In the embodiment, the SA may be a differential amplifier.

In some embodiments, the wafer may have a first surface and a second surface located on the opposite surfaces of the wafer in the thickness direction respectively.

Figure 6:
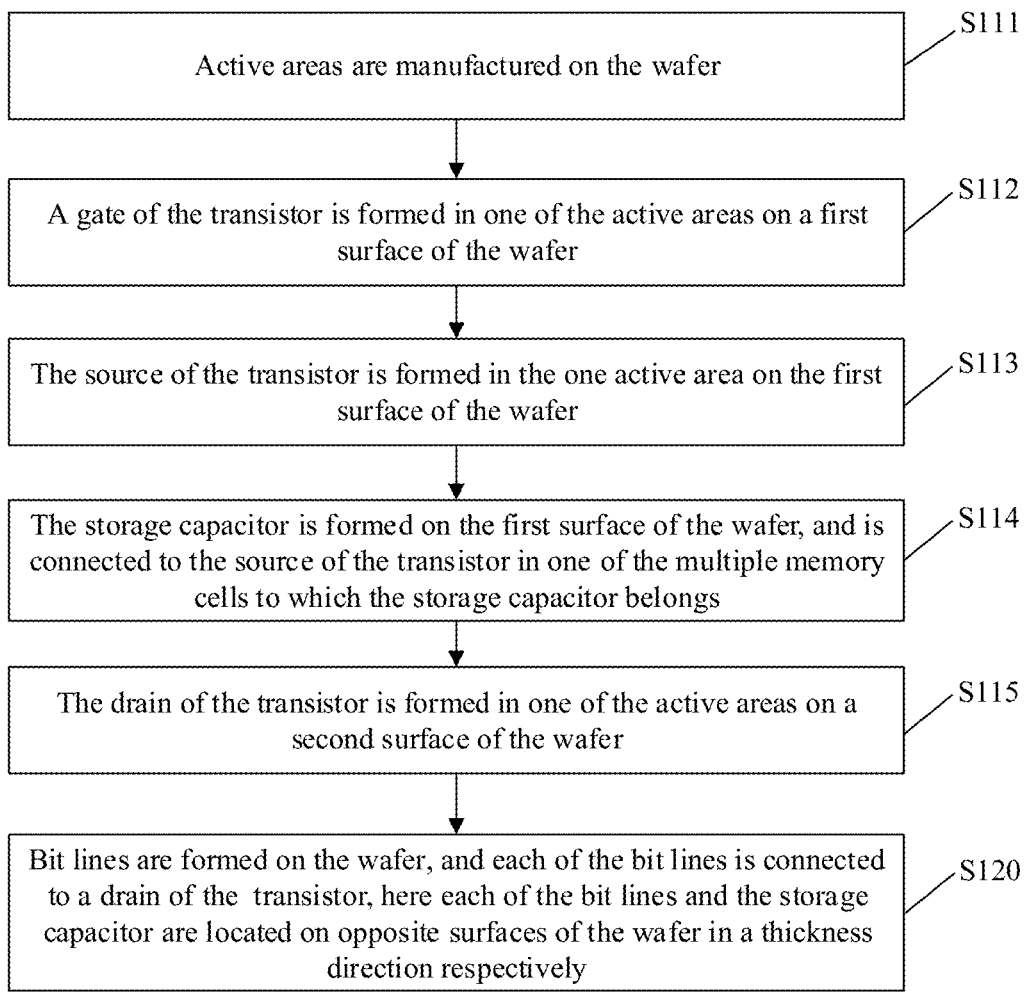
FIG. 6 illustrates a schematic flowchart of a method for manufacturing a memory device according to an exemplary embodiment.

As shown in FIG. 6, the operation S110 may include the following operations.

In operation S111, active areas are manufactured on the wafer.

In operation S112, a gate of the transistor is formed in one of the active areas on a first surface of the wafer.

In operation S113, the source of the transistor is formed in the one active area on the first surface of the wafer.

In operation S114, storage capacitors are formed on the first surface of the wafer, and each of the storage capacitors is connected to the source of the transistor in one of the multiple memory cells to which the storage capacitor belongs.

In operation S115, the drain of the transistor is formed in one of the active areas on a second surface of the wafer.

In the embodiment, the first surface and the second surface of the wafer in the thickness direction may be an upper surface and a lower surface of the wafer respectively. The storage capacitor in the memory cell has one end connected to the source of the transistor in the memory cell and the other end grounded, and is used to store data written into the memory cell.

Figure 7:
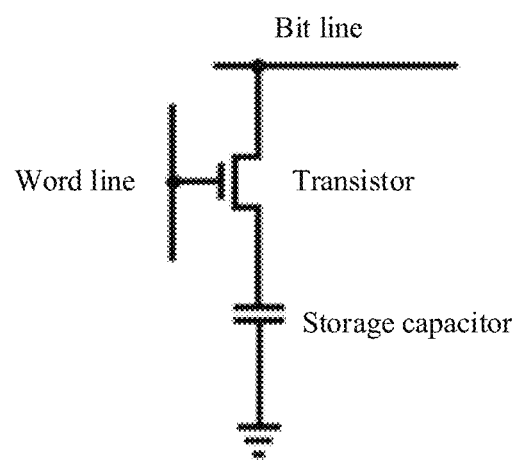
FIG. 7 illustrates a schematic structural diagram of a memory cell according to an exemplary embodiment.
Figure 8:
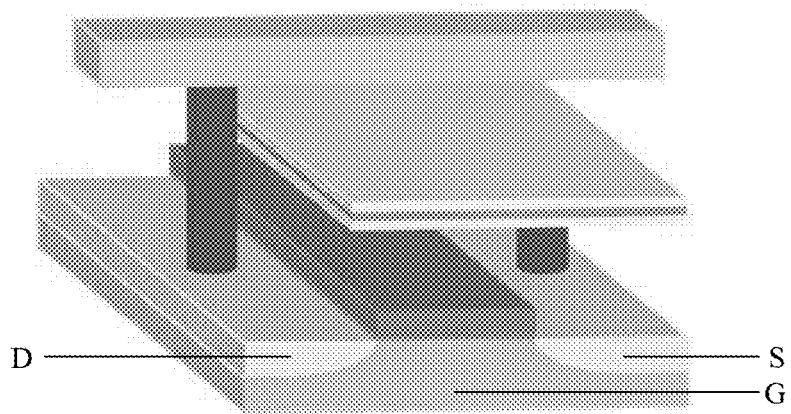
FIG. 8 illustrates a schematic structural diagram of a memory cell according to an exemplary embodiment.

In an embodiment, as shown in FIG. 7, the memory cell may include a transistor and a storage capacitor operated by the transistor. That is, each memory cell may be a memory cell with an architecture of one transistor T and one storage capacitor C (1T1C). As shown in FIG. 8, in the memory cell, the storage capacitor is connected to the source S of the transistor, and is used to store data written into the memory cell. A word line is connected to the gate G of the transistor, and is used to provide a word line voltage, and control the transistor to be turned on or off by the word line voltage. A bit line is connected to the drain D of the transistor, and is used to perform a read or write operation on the memory cell to which the transistor belongs, when the transistor is turned on.

In an embodiment, active areas are manufactured on the wafer and are used to form a transistor. For example, the active areas may be formed on the wafer by using a manufacturing process such as masking, etching, photolithography, etc. The active areas include an active area formed on the second surface of the wafer and an active area formed on the first surface of the wafer.

Figure 9:
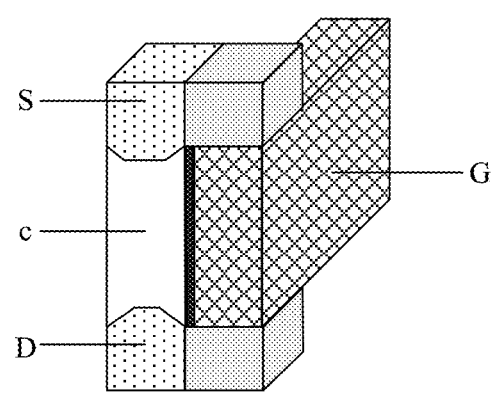
FIG. 9 illustrates a schematic structural diagram of a transistor according to an exemplary embodiment.

In another embodiment, the transistor further includes a channel region c and selects a VCAT structure. As shown in FIG. 9, the channel region c is disposed perpendicular to the wafer. The source S and the drain D are located at two ends of the channel region c respectively. That is, the drain and the source of the transistor are located on the second surface and the first surface respectively. Therefore, the drain is formed in the active area on the second surface of the wafer. The source is formed in the active area on the first surface of the wafer. The gate G of the transistor is located on a side of the channel region, and the gate may be formed in the active area on the first surface.

Because the source is formed on the first surface of the wafer, the storage capacitor connected to the source of the transistor is also formed on the first surface of the wafer.

In another embodiment, the method further includes the following operations. Before the manufacturing process is performed on the first surface of the wafer, a planarization operation is performed on the first surface.

Figure 10:
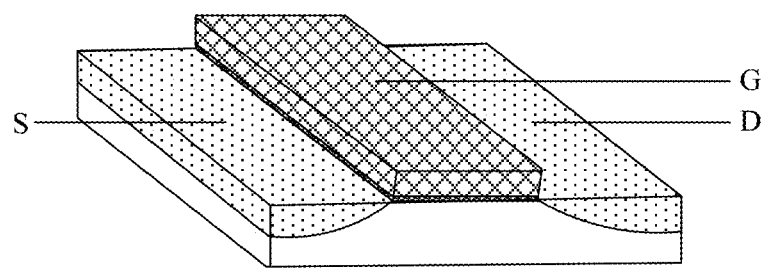
FIG. 10 illustrates a schematic structural diagram of a planar transistor in the related art.
Figure 11:
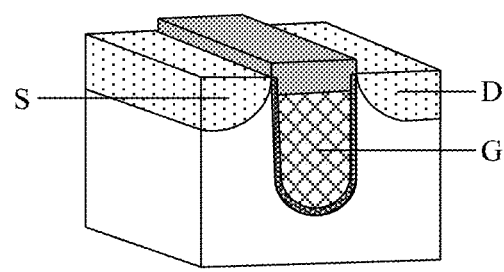
FIG. 11 illustrates a schematic structural diagram of a Buried Channel Array Transistor (BCAT) in the related art.

In this way, compared with a planar transistor shown in FIG. 10 and a BCAT architecture shown in FIG. 11 in the related art, according to a transistor arrangement based on a VCAT architecture on the wafer, the source and the drain do not need to be located on the same surface of the wafer, areas occupied by each transistor and a memory cell to which the transistor belongs on the surface of the wafer may be further reduced, thereby greatly increasing a number of memory cells that may be arranged on the wafer and utilization of the wafer. In addition, because the source and the drain are not located on the same side of the wafer anymore, and the storage capacitor connected to the source and the bit line connected to the drain are not located on the same side anymore, the dense arrangement of storage capacitors does not occupy a space above the bit line anymore, and a space for leading out a connecting wire may be provided above the bit line, so that it is implemented that the position where the bit line and the SA are connected may be located at any position on the bit line, but is not limited to only endpoint of the bit line anymore.

Figure 12:
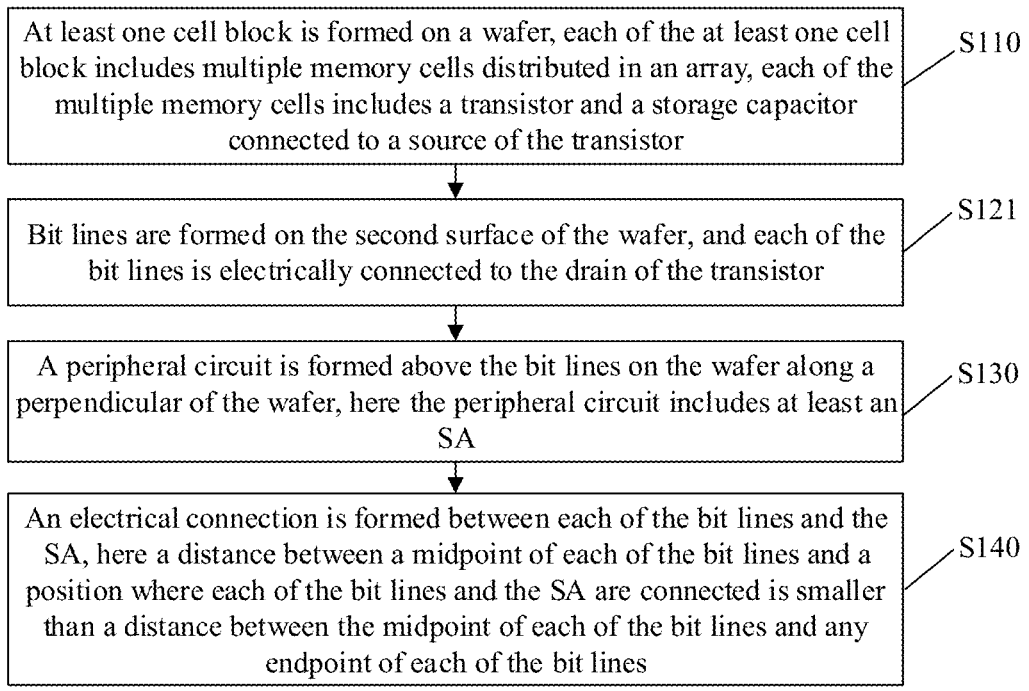
FIG. 12 illustrates a schematic flowchart of a method for manufacturing a memory device according to an exemplary embodiment.

In some embodiments, as shown in FIG. 12, the operation S120 may include the following operations.

In operation S121, bit lines are formed on the second surface of the wafer, and each of the bit lines is electrically connected to the drain of the transistor.

In the embodiment, the bit line is connected to the drain of the transistor, and the drain is located on the second surface of the wafer. Therefore, when the bit line is formed on the second surface of the wafer, it is easy to establish a connection with the drain of the transistor.

Figure 13:
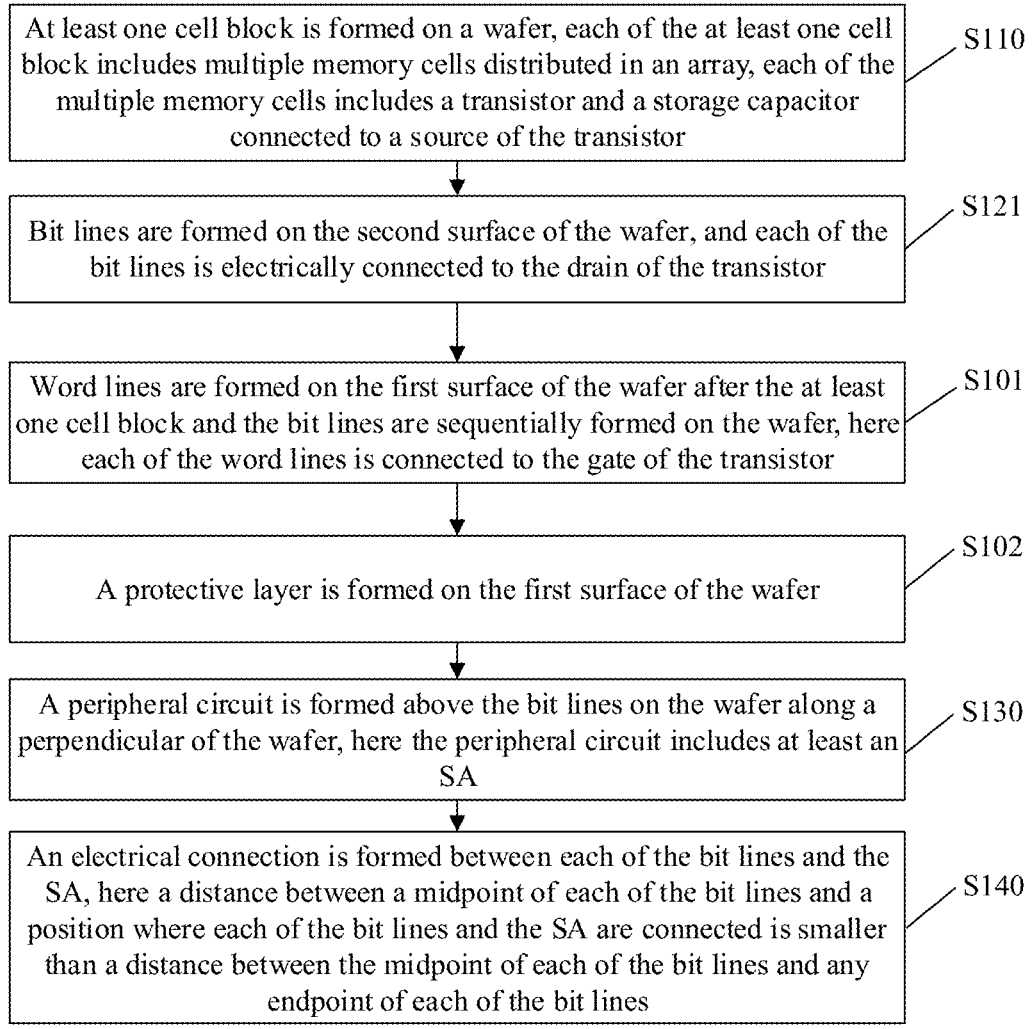
FIG. 13 illustrates a schematic flowchart of a method for manufacturing a memory device according to an exemplary embodiment.

In some embodiments, as shown in FIG. 13, the method may further include the following operations.

In operation S101, word lines are formed on the first surface of the wafer after the at least one cell block and the bit lines are sequentially formed on the wafer, here each of the word lines is connected to the gate of the transistor.

In operation S102, a protective layer is formed on the first surface of the wafer.

In the embodiment, the wafer further includes a word line connected to the gate of the transistor in the memory cell. For example, a word line may be connected to the gate of the transistor of each memory cell in the same row of each of the at least one cell block. The word line is connected to the gate of the transistor, and is used to provide a word line voltage, and control the transistor to be turned on or off by the word line voltage. Because the gate of the transistor is manufactured on the first surface of the wafer, it is easy to establish a connection with the gate of the transistor when the word line is formed on the first surface.

In an embodiment, because a transistor with a VCAT architecture is used and the drain and the source are located on the upper surface and the lower surface of the wafer respectively, manufacturing process on the wafer is not limited to only one surface anymore. After the word line is formed, the protective layer is formed on the first surface of the wafer, to provide protection for the first surface, thereby preventing influence of the manufacturing process on the second surface and a process of establishing a connection on the first surface.

In an embodiment, another wafer may be bonded on the first surface of the wafer formed with the word line, to form the protective layer for the first surface, to avoid damage such as cutting or scratching the first surface by other manufacturing process; or the protective layer may be formed by applying a material of a particular composition, for example, a mixture of aluminum oxide and glycerol in a particular ratio, polyimide, or the like.

In this way, the protective layer is formed on the first surface, so that the influence and damage caused by the manufacturing process on the second surface to the first surface may be effectively reduced.

Figure 14:
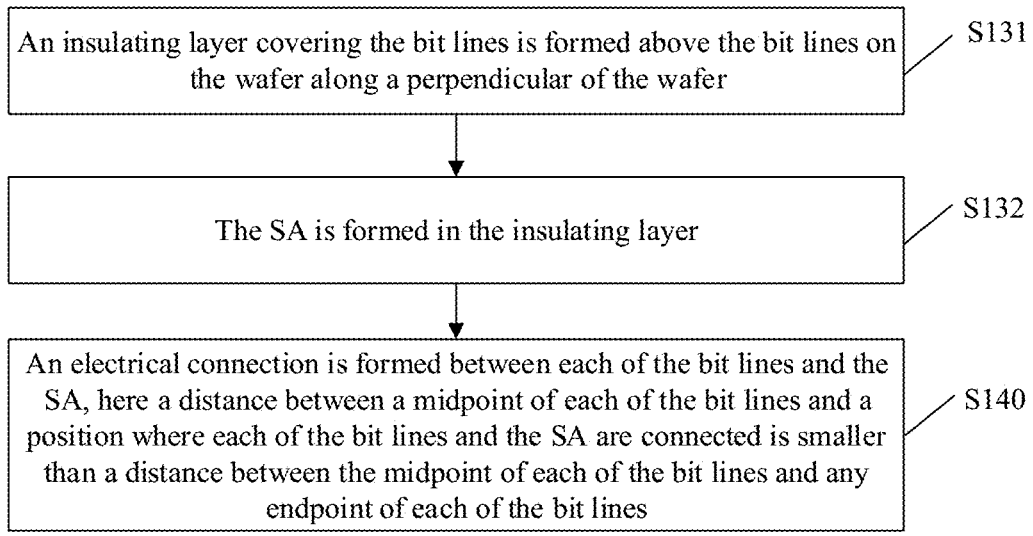
FIG. 14 illustrates a schematic flowchart of a method for manufacturing a memory device according to an exemplary embodiment.

In some embodiments, as shown in FIG. 14, the operation S130 may include the following operations.

In operation S131, an insulating layer covering the bit lines is formed above the bit lines on the wafer along a perpendicular of the wafer.

In operation S132, the SA is formed in the insulating layer.

In the embodiment, after the cell block and the bit line are formed on the wafer, deposition may be performed based on a mask to form the insulating layer covering the bit line, to protect the bit line from being exposed to air. The SA is formed in the insulating layer and is located above the bit line, and the SA and the bit line may be connected at any position on the bit line through a through hole, to implement a 3D structure on a wafer. In this way, a space of the insulating layer covering the bit line may be fully utilized, and it is not necessary to form the SA above the insulating layer anymore.

In some embodiments, the operation S140 may include the following operations.

In operation S141, a first connection terminal of each of the bit lines is aligned with a second connection terminal of the SA, and the aligned first connection terminal and second connection terminal are bonded.

Here a position where the first connection terminal and the second connection terminal are bonded is located in a midpoint area of each of the bit lines, and the midpoint area includes a midpoint of each of the bit lines, and a distance between a boundary of the midpoint area and the midpoint is smaller than a distance between the boundary and any endpoint of each of the bit lines.

In an embodiment, the first connection terminal is a connection terminal led out from the connection position on the bit line on the second surface of the wafer, and the second connection terminal is a connection terminal led out from the SA on the wafer. Based on the connection between the first connection terminal and the second connection terminal, an electrical connection between the bit line and the SA may be implemented.

For example, after the bit line is manufactured, the insulating layer for covering and protecting the bit line is formed on the bit line. The insulating layer is etched at a preset connection position to form a through hole. A conductive material is deposited in the through hole to form the first connection terminal on the bit line.

In another example, after the bit line is manufactured, the first connection terminal is formed on the bit line, and then the insulating layer for protecting sides of the first connection terminal and the bit line is deposited. A top surface of the insulating layer is flush with a top surface of the first connection terminal or is slightly lower than the top surface of the first connection terminal, to form a connection between the SA and the first connection terminal.

In still another example, during patterned deposition based on a mask, when the bit line is manufactured, deposition is performed synchronously to form the first connection terminal, and then the insulating layer covering a top surface of the bit line and sides of the first connection terminal is formed. A top surface of the insulating layer may be flush with a top surface of the first connection terminal or slightly lower than the top surface of the first connection terminal. In this way, the bit line and the first connection terminal are formed together through deposition, and manufacturing thereof is simple.

In another embodiment, the cell block and the bit line are formed on the first wafer. The SA is formed on the second wafer. The storage capacitor is manufactured on an upper surface of the first wafer, and the bit line is manufactured on a lower surface of the first wafer. The first wafer is inverted, and the lower surface of the first wafer with the bit line faces upward. Therefore, the SA may be manufactured on a lower surface of the second wafer, to easily form a connection with the bit line of the underneath first wafer. The second connection terminal may be manufactured on connecting wires at two ends of the SA. For example, after the SA and the connecting wires at two ends of the SA are manufactured, the insulating layer covering and protecting the connecting wires is formed on the connecting wires, and a through hole in communication with the connecting wires of the SA is formed in the insulating layer. A conductive material is deposited in the through hole to form the second connection terminal.

In another example, the cell block and the bit line are formed on the first wafer. The SA is formed on the second wafer. After the SA and the connecting wires at two ends of the SA are manufactured, the second connection terminal is formed on the connecting wire, and then the insulating layer covering sides of the second connection terminal and the connecting wire is formed through deposition. A top surface of the insulating layer is flush with a top surface of the second connection terminal or is slightly lower than the top surface of the second connection terminal.

In still another example, the cell block and the bit line are formed on the first wafer, and the SA is formed on the second wafer. During patterned deposition based on a mask, when the connecting wires at two ends of the SA are manufactured, deposition is performed synchronously to form the second connection terminal, and then the insulating layer covering a top surface of the connecting wire and sides of the second connection terminal is formed. A top surface of the insulating layer may be flush with a top surface of the second connection terminal or slightly lower than the top surface of the second connection terminal. In this way, deposition is performed synchronously to form the connecting wires of the SA and the second connection terminal, so that the time of manufacturing process may be reduced, and manufacturing efficiency may be improved.

In the embodiment, the first connection terminal is located at the bit line, and the second connection terminal is located at the SA. The position where the first connection terminal and the second connection terminal are bonded is located in an area around a midpoint of the bit line. Because two ends of the SA are bonded to a first connection terminal respectively, it needs to be satisfied that bonding positions at two ends have equal distances to the SA. Therefore, when the bonding position is located in an area around the midpoint of the bit line, the amplification of a signal in the bit line may be better implemented.

In this way, it is easy to flexibly adjust the bonding position according to actual arrangement of cell blocks on the wafer and the sizes and arrangement of the SAs, so that an electrical connection may be effectively formed between the first connection terminal and the second connection terminal.

Figure 15:
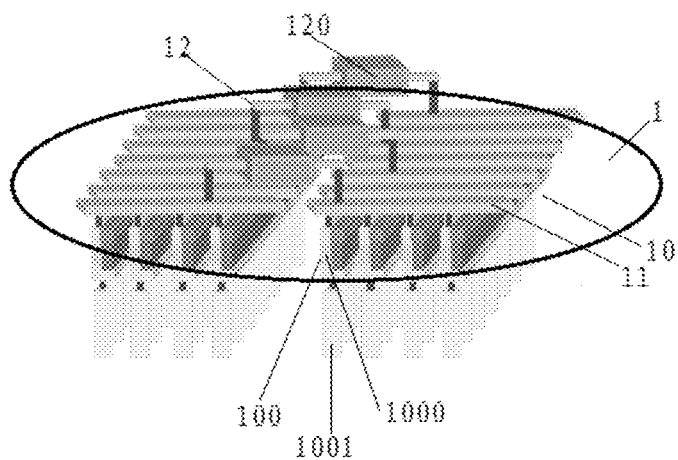
FIG. 15 illustrates a schematic structural diagram of a memory according to an exemplary embodiment.

As shown in FIG. 15, the embodiment provides a memory, the memory may include at least a wafer 1, at least one cell block 10 and bit lines 11, and a peripheral circuit 12.

At least one cell block 10 and bit lines 11 are located on the wafer 1, each of the at least one cell block 10 includes multiple memory cells 100 distributed in an array, each of the multiple memory cells 100 includes a transistor 1000 including a source S, a gate G and a drain D and a storage capacitor 1001 connected to the source S of the transistor 100, each of the bit lines 11 is connected to the drain of the transistor 1000 in each of the multiple memory cells 100 in the same column of each of the at least one cell block 10, and each of the bit lines 11 and the storage capacitor 1001 are located on opposite surfaces of the wafer 1 in a thickness direction respectively.

The peripheral circuit 12 is located above the bit lines 11 on the wafer 1 along a perpendicular of the wafer 1, here the peripheral circuit 12 includes at least an SA 120.

Here a distance between a midpoint of each of the bit lines 11 and a position where each of the bit lines 11 and the SA 120 are connected is smaller than a distance between the midpoint of each of the bit lines 11 and any endpoint of each of the bit lines 11.

In the embodiment, the drain D and the source S of the transistor 1000 are located on an upper surface and a lower surface of the wafer 1 respectively. The bit line 11 is connected to the drain D, and is located on the same surface of the wafer 1 as the drain D.

In some embodiments, the connection position is the midpoint of each of the bit lines 11.

In some embodiments, the memory may further include word lines 13 located on the wafer 1, here each of the word lines 13 is connected to the gate G of the transistor 1000 in each of the multiple memory cells 100 in the same row of each of the at least one cell block 10.

In some embodiments, the transistor 1000 may further include a channel region c formed in the thickness direction of the wafer 1.

The source S is located at a first end of the channel region c.

The drain D is located at a second end of the channel region c, here the first end and the second end are opposite ends of the channel region c in the thickness direction of the wafer 1 respectively.

The gate G is located on a side of the channel region c and has a direction consistent with that of the channel region c.

In order to understand the embodiments of the disclosure better, the technical solutions of the disclosure are further described below with reference to an exemplary embodiment.

Figure 16:
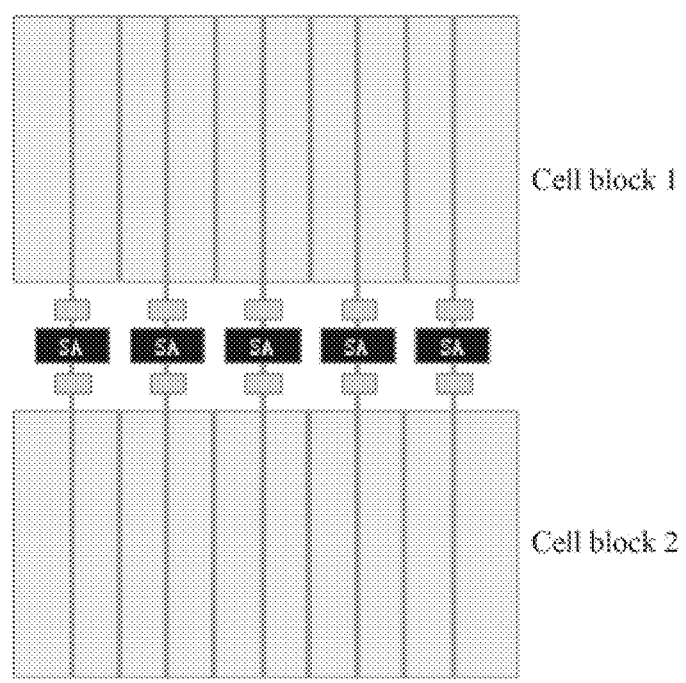
FIG. 16 illustrates a schematic structural diagram of a connection between a cell block and an SA in the related art.

As shown in FIG. 16, in a memory device in the related art, a cell block and an SA are located in the same plane. The SA is usually located between an upper cell block and a lower cell block. As sizes of manufacturing processes decrease, a size of a memory cell in a cell block becomes increasingly smaller, whereas a size of an SA decreases at a slower pace. A proportion of an area occupied by an SA on a wafer is increasingly higher (usually greater than 10%). Therefore, the area occupied by the SA restricts the progress that the manufacturing processes further decrease in sizes.

Because the SA and a bit line are located in the same plane, storage capacitors are densely arranged above the bit line. When a point where the bit line and the SA are connected is located in a middle area of the bit line, there needs a lead wire to be connected to the SA from the middle area. Such lead wire space cannot be reserved in an interval between the densely arranged storage capacitors. As a result, the connecting point cannot be located in the middle area of the bit line.

Figure 17:
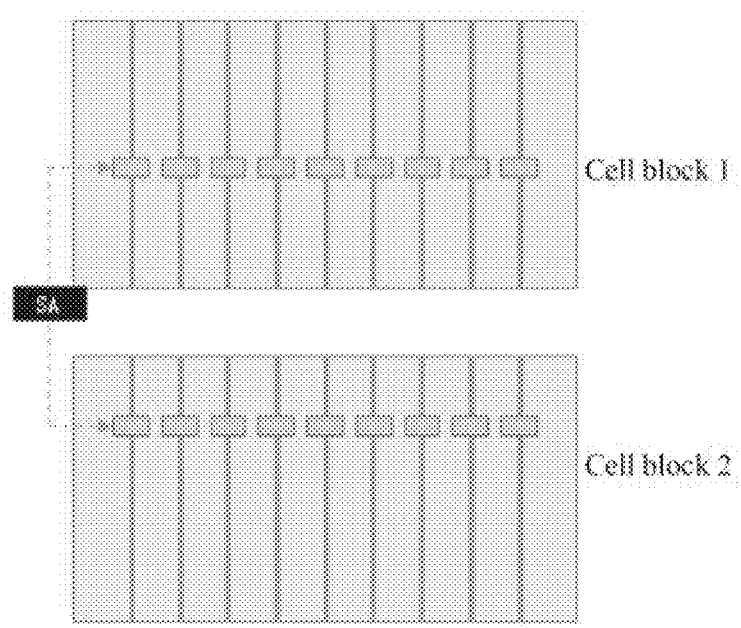
FIG. 17 illustrates a schematic structural diagram of a connection between a cell block and an SA according to an exemplary embodiment.

As shown in FIG. 17, according to the embodiment, an SA and a cell block are located in different planes. The embodiment provides a method for manufacturing a memory device, applicable to manufacturing an SA and a cell block on the same wafer, and including:
1. manufacturing process on a front surface of a wafer, including isolation of an active area and manufacturing a bit line and a word line, here the bit line and the word line are connected to an SA on the wafer;
2. planarization of a rear surface of the wafer; and
3. process of manufacturing a storage capacitor on the rear surface of the wafer.

The embodiment further provides a method for manufacturing a memory device, applicable to manufacturing an SA and a cell block on different wafers, and including:
1. manufacturing process on a first surface of a first wafer, including isolation of an active area, and manufacturing a word line and a storage capacitor;
2. inversion of the first wafer, and planarization of a second surface of the first wafer;
3. process of manufacturing a bit line on the second surface of the first wafer;
4. process of manufacturing the SA on a first surface of a second wafer; and
5. inversion of the second wafer, here the second surface of the first wafer is electrically connected to the first surface of the second wafer.

An embodiment of the disclosure provides an electronic device. The electronic device includes a processor and a memory configured to store a computer program executable on the processor. The processor executes the computer program to perform operations of the method in one or more of the foregoing technical solutions.

An embodiment of the disclosure further provides a computer-readable storage medium. The computer-readable storage medium stores computer-executable instructions. The computer-executable instructions are executed by a processor to implement the method in one or more of the foregoing technical solutions.

The computer-readable storage medium provided in the embodiment may be a non-transient storage medium.

In several embodiments provided in the disclosure, it should be understood that the disclosed devices and methods may be implemented in another manner. The above device embodiments are merely illustrative. For example, the division of units is only a logical function division, and there may be other divisions in actual implementation, for example, multiple units or components may be combined, or may be integrated into another system, or some features may be ignored or not implemented. In addition, the components as shown or discussed are coupled to each other or directly coupled, or communication connection between the components may be implemented through some interfaces, indirect coupling or communication connection between the devices or units may be electrical, mechanical or other forms of coupling or connection.

The above units described as separate components may be or may not be physically separate, and the components displayed as units may be or may not be physical units, that is, they may be located at one place or distributed on multiple network units; some or all of the units may be selected according to actual needs to achieve the purpose of the solutions of the embodiments.

In addition, all the functional units in the embodiments of the disclosure may be integrated into a processing module, or each of the units may exist alone, or two or more of the units are integrated into a unit. The integrated unit may be implemented in the form of hardware or in the form of hardware in combination with a software functional unit.

In some cases, any two of the foregoing technical features may be combined without a conflict to obtain a new method technical solution.

Those of ordinary skill in the art may understand that all or part of the operations implementing the foregoing method embodiments may be accomplished by a program instructing relevant hardware. The foregoing program may be stored in a computer-readable storage medium. The problem, when being executed, performs the operations in the foregoing method embodiments. The foregoing storage medium includes various media that may store program codes, such as a removable memory device, Read-Only Memory (ROM), Random Access Memory (RAM), a magnetic disk or an optical disc.

The above are only specific implementations of the disclosure, but the protection scope of the disclosure is not limited thereto. Any person skilled in the art may easily conceive of changes or substitutions within the technical scope disclosed in the disclosure, and these changes or substitutions should fall within the protection scope of the disclosure. Therefore, the protection scope of the disclosure shall be subject to the protection scope of the claims.

The invention claimed is:

1. A method for manufacturing a memory device, comprising:
    forming, on a wafer, at least one cell block, each of which comprising a plurality of memory cells distributed in an array, each of the plurality of memory cells comprising a transistor and a storage capacitor connected to a source of the transistor;
    forming bit lines on the wafer and connecting each of the bit lines to a drain of the transistor, wherein each of the bit lines and the storage capacitor are located on opposite surfaces of the wafer in a thickness direction respectively;
    forming a peripheral circuit above the bit lines on the wafer along a perpendicular of the wafer, wherein the peripheral circuit comprises at least a Sensing Amplifier (SA); and
    forming an electrical connection between the bit line and the SA,
    wherein a distance between a midpoint of each of the bit lines and a position where each of the bit lines and the SA are connected is smaller than a distance between the midpoint of each of the bit lines and any endpoint of each of the bit lines.

2. The method of claim 1, wherein the wafer has a first surface and a second surface located on the opposite surfaces of the wafer in the thickness direction respectively; and
    the forming at least one cell block on the wafer comprises:
    manufacturing active areas on the wafer;
    forming a gate of the transistor in one of the active areas on a first surface of the wafer;
    forming the source of the transistor in the one active area on the first surface of the wafer;
    forming storage capacitors on the first surface of the wafer, and connecting each of the storage capacitors to the source of the transistor in one of the plurality of memory cells to which the storage capacitor belongs; and
    forming the drain of the transistor in one of the active areas on a second surface of the wafer.

3. The method of claim 2, wherein the forming the bit lines on the wafer and connecting each of the bit lines to the drain of the transistor comprises:
    forming bit lines on the second surface of the wafer and electrically connecting each of the bit lines to the drain of the transistor.

4. The method of claim 2, further comprising:
    forming word lines on the first surface of the wafer after the at least one cell block and the bit lines are sequentially formed on the wafer, wherein each of the word lines is connected to the gate of the transistor; and
    forming a protective layer on the first surface of the wafer.

5. The method of claim 2, wherein the forming the peripheral circuit above the bit lines on the wafer comprises at least:
    forming an insulating layer covering the bit lines above the bit lines on the wafer; and
    forming the SA in the insulating layer.

6. The method of claim 5, wherein the forming the electrical connection between the bit line and the SA comprises:
    aligning a first connection terminal of each of the bit lines with a second connection terminal of the SA, and bonding the aligned first connection terminal and second connection terminal,
    wherein a position where the first connection terminal and the second connection terminal are bonded is located in a midpoint area of each of the bit lines, and the midpoint area comprises a midpoint of each of the bit lines, and a distance between a boundary of the midpoint area and the midpoint is smaller than a distance between the boundary and any endpoint of each of the bit lines.

7. A memory, comprising at least:
    a wafer;
    at least one cell block and bit lines located on the wafer, each of the at least one cell block comprising a plurality of memory cells distributed in an array, each of the plurality of memory cells comprising a transistor comprising a source, a gate and a drain and a storage capacitor connected to the source of the transistor, each of the bit lines connected to the drain of the transistor in each of the plurality of memory cells in the same column of each of the at least one cell block, and each of the bit lines and the storage capacitor located on opposite surfaces of the wafer in a thickness direction respectively; and
    a peripheral circuit located above the bit lines on the wafer along a perpendicular of the wafer, wherein the peripheral circuit comprises at least a Sensing Amplifier (SA), wherein a distance between a midpoint of each of the bit lines and a position where each of the bit lines and the SA are connected is smaller than a distance between the midpoint of each of the bit lines and any endpoint of each of the bit lines.

8. The memory of claim 7, wherein the connection position is located at the midpoint of each of the bit lines.

9. The memory of claim 7, further comprising word lines located on the wafer, wherein each of the word lines is connected to the gate of the transistor in each of the plurality of memory cells in the same row of each of the at least one cell block.

10. The memory of claim 7, wherein the transistor further comprises a channel region formed in the thickness direction of the wafer;
   the source is located at a first end of the channel region;
   the drain is located at a second end of the channel region, wherein the first end and the second end are opposite ends of the channel region in the thickness direction of the wafer respectively; and
   the gate is located on a side of the channel region and has a direction consistent with that of the channel region.

\* \* \* \* \*